(12) United States Patent
Tagishi

(10) Patent No.: US 6,417,776 B1
(45) Date of Patent: Jul. 9, 2002

(54) INPUT BUFFER CIRCUIT HAVING FUNCTION FOR DETECTING CABLE CONNECTION

(75) Inventor: Mitsuaki Tagishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/651,987

(22) Filed: Aug. 30, 2000

(30) Foreign Application Priority Data

Aug. 30, 1999 (JP) ............................................ 11-243853

(51) Int. Cl.⁷ ................................................ G08B 21/00
(52) U.S. Cl. .................... 340/635; 340/652; 340/870.16
(58) Field of Search ................................ 340/635, 649, 340/650, 652, 595, 596, 870.16, 870.18; 365/191, 198; 324/529, 530, 328

(56) References Cited

U.S. PATENT DOCUMENTS

| | | | | |
|---|---|---|---|---|
| 4,441,107 A | * | 4/1984 | Chaborski et al. | ..... 340/870.16 |
| 4,567,428 A | * | 1/1986 | Zbinden | ...................... 324/554 |
| 4,855,722 A | | 8/1989 | Mostyn et al. | |
| 5,193,108 A | * | 3/1993 | Stocklin | ........................ 379/21 |
| 6,166,971 A | * | 12/2000 | Tamura et al. | ............... 365/198 |

FOREIGN PATENT DOCUMENTS

| | | |
|---|---|---|
| JP | 57-203305 | 12/1982 |
| JP | 60-252928 | 12/1985 |
| JP | 03-104351 | 5/1991 |
| JP | 4-351417 | 12/1992 |
| JP | 11-45130 | 2/1999 |

\* cited by examiner

Primary Examiner—Van Trieu
(74) Attorney, Agent, or Firm—Katten Muchin Zavis Rosenman

(57) ABSTRACT

An input buffer circuit having a function to detect whether or not a cable is connected includes a differential circuit for receiving differential data having first data and second data, and changing a signal level of an output signal when a difference between a signal level of the first data and a signal level of the second data exhibits a predetermined value. The input buffer further includes a conversion circuit for matching the signal level of the output signal to a specific band level.

13 Claims, 11 Drawing Sheets

INPUT BUFFER CIRCUIT HAVING FUNCTION FOR DETECTING CABLE CONNECTION

BACKGROUND OF THE INVENTION

1. Field of the Invention

The present invention relates to an input buffer circuit for receiving differential data through a cable and for detecting the state of cable connection. The cable has a characteristic impedance and terminating resistors are coupled with the cable, and the input buffer circuit has the ability to determine whether the cable is connected.

2. Description of the Related Art

High-speed transmission of signals through a signal transmission medium requires adjustments of impedance and signal amplitude. In this case, the signal transmission medium is a cable. The impedance refers to the characteristic impedance (Z0) of the cable and the load impedance (ZL) of a load connected to the cable. Also, the transmission of signals may be carried out using the basic serial protocol, Universal Serial Bus (USB) protocol, IEEE 1394 protocol, or the like.

FIG. 7 illustrates the connection relationship between the characteristic impedance and the load impedance. A driver 2 is connected to the input end of the cable 1, and a load 3 is connected to the output end of the cable 1. The cable 1 has a characteristic impedance Z0, and the load 3 has a load impedance ZL. The driver 2 represents a transmitting circuit for sending signals, and the load 3 represents a receiving circuit for receiving signals.

Unless the characteristic impedance Z0 and the load impedance ZL are matched, signals are reflected in the cable 1. The magnitude of reflection is expressed by the following reflection coefficient.

Reflection coefficient=reflection voltage/incident voltage=(ZL−Z0)/(ZL+Z0)

When the reflection coefficient is large, high-speed signal transmission becomes difficult.

Reducing the amplitude of the signal shortens the time required for signal level changes, and leads to an increase in the speed of signal transmission. There are two modes of signal level changes. One is a manner of signal change from high level to low level, and the other is a manner of signal change from low level to high level.

FIG. 8 illustrates the connection relationship between a terminating resistor and the characteristic impedance. In this diagram, the parts that are the same as those in FIG. 7 are shown by the same reference symbols (so that duplicate explanations are omitted). A receiver 4 and a terminating resistor 5 are connected to the output end of the cable 1. A terminating voltage Vt is impressed on (applied to) the terminating resistor 5. The receiver 4 is a receiving circuit for receiving signals. The terminating resistor 5 has a resistance value ZT matching the characteristic impedance Z0 of the cable 1. In this case, the characteristic impedance Z0 is 50 to 1,000 Ω. The resistance value ZT is the same as the characteristic impedance Z0. The terminating voltage Vt is chosen to be a value (0 to source voltage V) to suit the resistance value ZT.

The terminating resistor 5 enables the reflection voltage to become zero. When the reflection voltage is zero, the reflection coefficient of the cable 1 becomes zero. The magnitude of signal amplitude on the cable 1 is determined by the ratio of the impedance of the driver 2 and the resistance value ZT. The magnitude of the signal amplitude is minimized when the reflection coefficient is zero. Signals of small amplitude are received in the input buffer of the receiver 4. The input buffer has a differential circuit (differential amplifier circuit), and adjusts the amplitude levels of incoming signals and outputs signals whose amplitude levels have been adjusted. The receiver 4 then executes its own processing steps using the signals of the adjusted amplitude levels.

The technologies related to the differential circuit as above are disclosed in Japanese Unexamined Patent Application, First Publication No. Sho 57-203305 (reference 1) and Japanese Unexamined Patent Application, First Publication No. Sho 60-252928 (reference 2). Reference 1 discloses a technique of using the offset voltage of the differential circuit for temperature variation compensation and source voltage variation compensation.

In the USB protocol and IEEE 1394 protocol, whether the cable is attached (connected) to the board is monitored by a cable detection device. The technology related to detection of a cable connection is disclosed in U.S. Pat. No. 4,855,722 (reference 3, corresponding to Japanese Unexamined Patent Application, First Publication No. Sho 63-100380), Japanese Unexamined Patent Application, First Publication No. Hei 11-45130 (reference 4), and in Japanese Patent (Granted) Publication No. 2564432 (reference 5). Reference 3 discloses a differential circuit for detecting alternating current power loss. Reference 4 discloses a cable output control circuit according to the IEEE 1394 protocol. Reference 5 discloses a detection device for detecting disconnection of the signal transmission line of an electric apparatus.

FIG. 9 shows an example of the input buffer circuit for receiving signals through the cable. This input buffer comprises a first transistor 11, a second transistor 12, a constant current source 13, and resistors 14, 15. The input buffer is provided with a first terminating resistor 16 and a second terminating resistor 17. The input buffer is further provided with an output conversion circuit 18 and a non-inverting circuit 19.

The first and second transistors 11, 12 are comprised by n-channel field-effect transistors (FET). The gate lengths of the first and second transistors 11, 12 are equal. The differential circuit is comprised by the first transistor 11, the second transistor 12, the constant current source 13, and the resistors 14, 15. First input signal Si1 is input into the gate of the first transistor 11, and second input signal Si2 is input into the gate of the second transistor 12. Outputs from the differential circuit are input into the output conversion circuit 18. Output from the output conversion circuit 18 is input into the non-inverting circuit 19. Output from the non-inverting circuit 19 represents output signal So1.

FIG. 10 shows the operational characteristics of the input buffer shown in FIG. 9. In FIG. 10, the horizontal axis represents time axis, and the vertical axis represents voltage value axis. When the input signal Si2 is high level and the input signal Si1 is low level, the output signal So1 is at the low level. As the magnitude of the input signal Si1 increases, the magnitude of the input signal Si2 decreases. The magnitude of the input signal Si1 and the magnitude of the input signal Si2 become identical at time t1. At this point in time t1, the level of the output signal So1 changes from the low level to the high level.

FIG. 11 shows an example of the configuration of the USB system. The USB system shown in this diagram comprises a first USB board 21, a second USB board 22, and a cable 23. The first USB board 21 comprises a pull-up resistor 24, a driver 25, and a receiver 26. The second USB board 22 comprises a pull-down resistor 27, a driver 28, a receiver 29, and a cable detector 30.

The resistance value of the pull-up resistor 24 is 1.5 KΩ. The resistance value of the pull-down resistor 27 is 15 KΩ. The characteristic impedance Z0 of the cable 23 is 90 Ω.

The cable detector 30 detects a connection between the second USB board 22 and the cable 23. The connection is detected according to the effects of the pull-down resistor 27 and the pull-up resistor 24. That is, when the second USB board 22 and the cable 23 are not connected to each other, the input level of the second USB board 22 is set to the low level. This level setting is performed by the effect of the pull-down resistor 27, and the output of the cable detector 30 is set to the low level. When the second USB board 22 and the cable 23 are connected to each other, the input level of the second USB board 22 is set to the high level. This level setting is performed by the effect of the pull-up resistor 24, and the cable detector 30 outputs a high level signal.

When the signals are transmitted from the first USB board 21 to the second USB board 22, the signal level input into the receiver 29 changes. If the signal level does not change, the connection state of the cable 23 can be determined.

FIG. 12 shows an example of the configuration of the IEEE 1394 system. The IEEE 1394 system (referred to as the 1394 system hereinbelow) shown in this diagram comprises a board 31, a first cable 32, and a second cable 33. The board 31 is provided with a receiver 34, a comparator 35, a first terminating resistor 36, a second terminating resistor 37, a first comparison resistor 38 and a second comparison resistor 39. The first cable 32 and the second cable 33 are twisted-pair cables.

The first and second cables 32, 33 have a characteristic impedance of 110 Ω each, and the first and second terminating resistors 36, 37 have a resistance value of 55 Ω each. These resistance values are half the value of the characteristic impedance of the first and second cables 32, 33. The resistance values of the first and second comparison resistors 38, 39 are 7 KΩ each. A terminating voltage Vr is impressed on each of the first and second terminating resistors 36, 37. A reference voltage Vref is impressed on one input terminal (the inverting input terminal) of the comparator 35.

The comparator 35 detects the connections between the board 31 and the first cable 32, and between the board 31 and the second cable 33. To check these connections, the comparator 35 compares the input voltage and the reference voltage Vref That is, when the first and second cables 32, 33 are connected to the board 31, upon detecting that the input voltage>reference voltage Vref, the comparator 35 outputs a high level signal, while, upon detecting that the input voltage≦reference voltage Vref, the comparator 35 outputs a low level signal. In contrast to such a pattern of change in the output signal levels, when the first and second cables 32, 33 are not connected to the board 31, the pattern of change in the output signal levels from the comparator 35 becomes opposite to the pattern given above. Therefore, it is possible to determine the connection state of board 31 to the first cable 32 and to the second cable 33 according to the pattern of change in the signal levels of output signals from the comparator 35.

However, in the differential circuit in the input buffer described above (refer to FIG. 9), such a circuit is designed so that the level of output signal alternates when the values of the magnitude of the input signals (Si1, Si2) are equal (refer to FIG. 10). Therefore, when the cable is not connected, the level of the output signal is at an indeterminate level, because the values of the pair of input signals are the same in the open circuit condition. In this case, a circuit receiving the output signal of the indeterminate level is prone to malfunction and erroneous response.

In the USB system (refer to FIG. 11), the cable connection is checked (detected) by using a terminating resistance different from the characteristic impedance. If the characteristic impedance and the terminating resistance are made to match (have the same value) in such a USB system, cable detection becomes difficult because the internal circuitry for detecting the cable connection is not designed for such conditions.

In the 1394 system on the other hand, it is necessary to provide a comparator and a reference voltage prepared especially for cable detection purpose. Therefore, the input buffer circuit becomes more complex, which increases the size and expense of the circuit.

SUMMARY OF THE INVENTION

It is therefore an object of the present invention to provide an input buffer circuit having a function for detecting the cable connection to determine whether or not the cable is connected (attached), in which even if the input is in the open state, an indeterminate output signal is not generated.

To achieve this object, the first input buffer circuit according to the present invention comprises: a differential circuit for receiving differential data having first data and second data, and changing a signal level of an output signal when a difference between a signal level of the first data and a signal level of the second data exhibits a predetermined value; and a conversion circuit for matching the signal level of the output signal to a specific band level.

The second input buffer circuit according to the present invention comprises: a differential circuit for receiving differential data having first data and second data, and changing a signal level of an output signal when a signal level of the first data and a signal level of the second data are equal; a conversion circuit for matching the signal level of the output signal to a specific band level; and an output control circuit for setting the signal level of the output signal at a specific value according to the signal level of the first data and the signal level of the second data.

The third input buffer circuit according to the present invention receives a first signal and a second signal through a cable, and generates an output signal having a signal level determined by the magnitudes of those received signals. This third input buffer circuit includes a differential circuit for changing the signal level of the output signal when the magnitude of the first signal and the magnitude of the second signal are not equal.

The fourth input buffer circuit according to the present invention receives a first signal and a second signal through a cable, and generates an output signal having a signal level determined by the magnitudes of those received signals. This fourth input buffer circuit comprises: a differential circuit for determining the signal level of the output signal by its signal output, wherein the differential circuit outputs a signal to change the signal level of the output signal when the magnitude of the first signal and the magnitude of the second signal are equal; and an output control circuit for outputting a signal of a constant level when the magnitude of the first signal and the magnitude of the second signal are equal. In the fourth input buffer circuit of this structure, the signal output of the differential circuit is masked by using the signal of the constant level output from the output control circuit, and thereby the signal level of the output signal when the magnitude of the first signal and the magnitude of the second signal are equal is set to a determinate (defined) level.

DESCRIPTION OF THE PREFERRED EMBODIMENTS

Preferred embodiments will be explained in the following with reference to the drawings.

Embodiment 1

Figure 1:
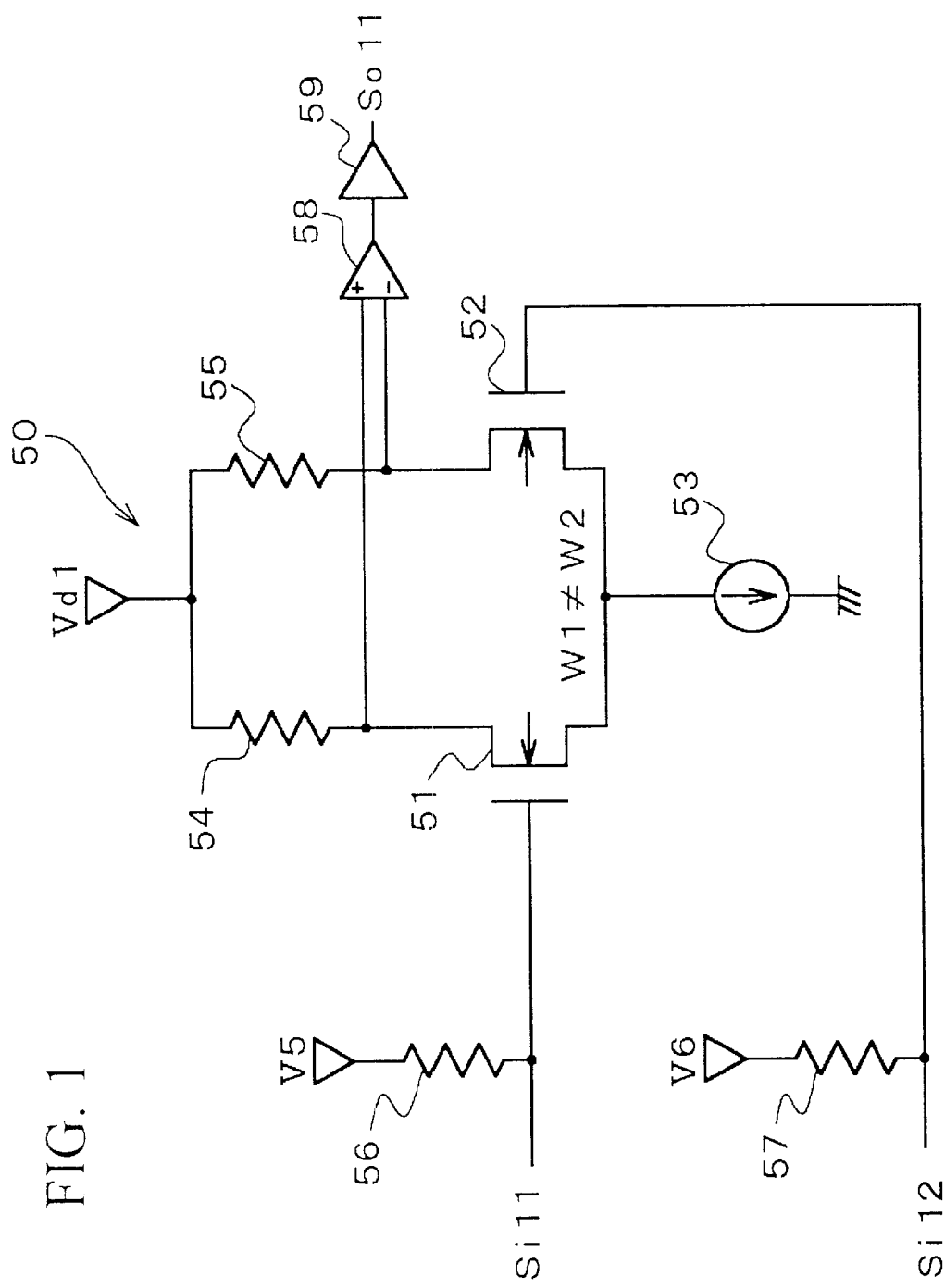
FIG. 1 is a schematic drawing of a first embodiment of the input buffer circuit with a function for detecting the cable connection, according to the present invention.

FIG. 1 shows a schematic diagram of the input buffer circuit 50 ("input buffer 50" hereinbelow) having a cable connection detection function, according to the first embodiment of the present invention. The input buffer 50 shown in this figure includes a first transistor 51, a second transistor 52, a constant current source 53, and resistors 54, 55. Also, the input buffer 50 is provided with terminating resistors 56, 57, and is further provided with an output conversion circuit 58 and a non-inverting circuit 59.

The drain (electrode) of the first transistor 51 is connected to the resistor 54. The gate (electrode) of the first transistor 51 is connected to the first terminating resistor 56. The source (electrode) of the first transistor 51 is connected to the constant current source 53. The drain (electrode) of the second transistor 52 is connected to the resistor 55. The gate (electrode) of the second transistor 52 is connected to the second terminating resistor 57. The source (electrode) of the second transistor 52 is connected to the constant current source 53. Further, the drain of the first transistor 51 is connected to the non-inverting input side (plus input terminal) of the output conversion circuit 58. The drain of the second transistor 52 is connected to the inverting input side (minus input terminal) of the output conversion circuit 58. Output of the output conversion circuit 58 is connected to the input of the non-inverting circuit 59.

The output of the constant current source 53 is grounded. A drain voltage Vd1 is impressed on the resistors 54, 55. A first terminating voltage V5 is impressed on the first terminating resistor 56. A second terminating voltage V6 is impressed on the second terminating resistor 57.

The differential circuit (differential amplifying circuit) in the input buffer 50 is comprised by the first transistor 51, the second transistor 52, the constant current source 53, and resistors 54, 55. The first and second transistors 51, 52 are both n-channel field-effect transistors (FETs). These first and second transistors 51, 52 form a part of the complementary metal oxide semiconductor (CMOS) circuit that includes the differential circuit. The constant current source 53 is a current regulation circuit to control the source current of the first and second transistors 51, 52.

The output conversion circuit 58 is a comparator to compare the input voltages. The output conversion circuit 58 converts the output signal level of the differential circuit to the band level of the CMOS circuit, and outputs the converted signal. The width of the band level is 0 to 5 V. The non-inverting circuit 59 is a latching circuit for temporary storage of a signal output from the output conversion circuit 58, and outputs the level of the retained signal as output signal So11. The first terminating resistor 56 has a resistance value that is equal to the characteristic impedance of the cable (omitted in the diagram) for transmitting the input signal Si11. The second terminating resistor 57 has a resistance value that is equal to the characteristic impedance of the cable (omitted in the diagram) for transmitting the input signal Si12. These cables are attached to the input buffer 50, and the buffer circuit is used by connecting one cable to the gate of the first transistor 51, and connecting the other cable to the gate of the second transistor 52.

The gate length of the first transistor 51 is W1, and the gate length of the second transistor 52 is W2. These gate lengths W1, W2 for the first and second transistors 51, 52 are designed to be different from each other (i.e., W1≠W2).

Figure 2:
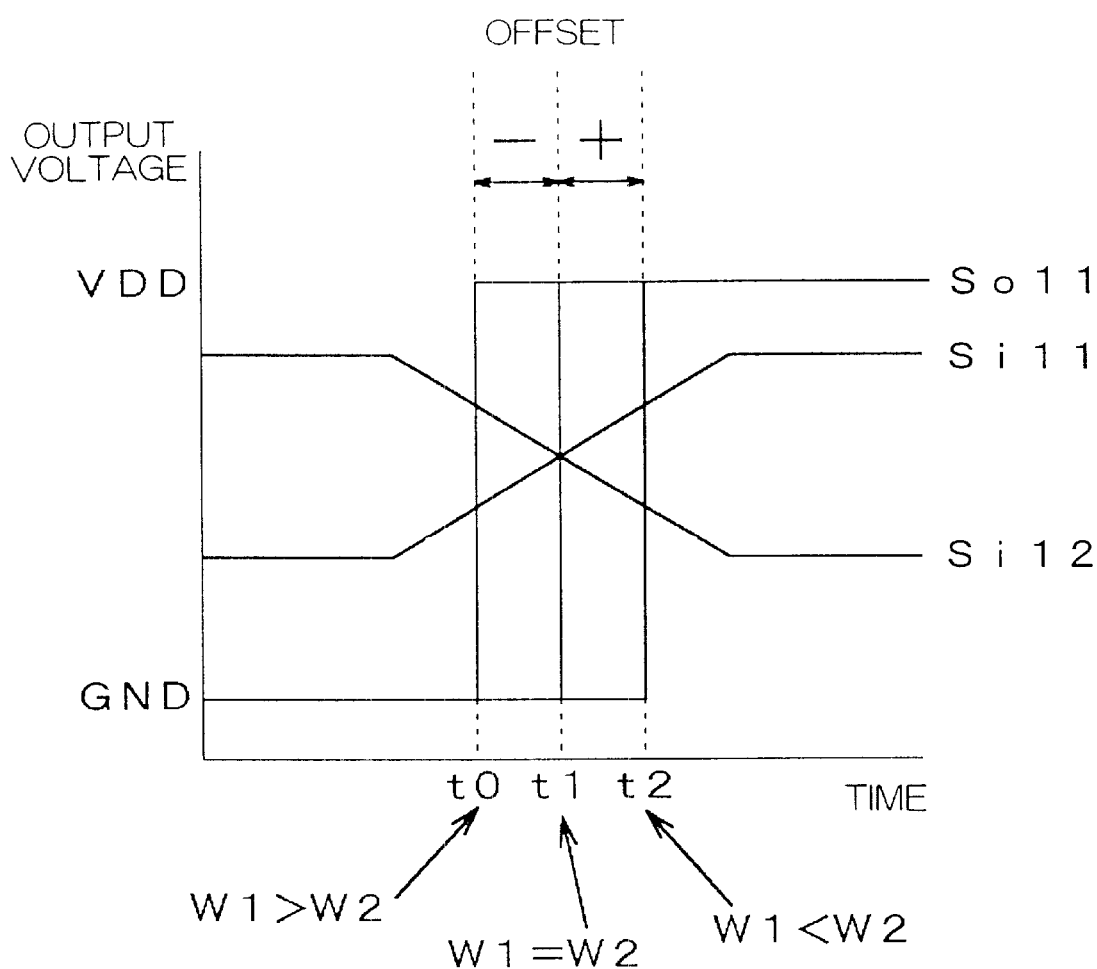
FIG. 2 is a graph to show the operating characteristics of the input buffer circuit shown in FIG. 1.

FIG. 2 shows the operating characteristics of the input buffer 50 shown in FIG. 1. The horizontal axis represents time axis and the vertical axis represents voltage value axis. When the input signal Si12 is high level and the input signal Si11 is low level, the output signal So11 is low level. Starting from this condition, as the magnitude of the input signal Si11 increases with passage of time, the magnitude of the input signal Si12 correspondingly decreases with passage of time.

Now, it is assumed that the magnitude of the input signal Si11 becomes identical to the magnitude of the input signal Si12 at time t1. In this case, if the gate length W1 of the first transistor 51 was equal to the gate length W2 of the second transistor 52, then at that point in time t1, the signal level of the output signal So11 switches to high level.

However, in this embodiment 1, the gate lengths W1, W2 in the input buffer 50 are different from each other. That is, the gate length W1 is chosen longer than the gate length W2 (W1>W2), as an example. Accordingly, the differential circuit is given a minus offset. In such a case, the signal level of the output signal So11 switches to high level at a point in time t0, which is earlier than time t1.

Also, in another example, the gate length W1 is set shorter than the gate length W2 (W1<W2). In this case, the differential circuit is given a plus offset. In such a case, the signal level of the output signal So11 switches to high level at a point in time t2, which is later than time t1.

When the cables are detached from the input buffer 50, the two input points of the differential circuit are in the open condition. In response to this, if the differential circuit is given a minus offset as described above, the output signal So11 turns to the high level. On the other hand, if the differential circuit is given a plus offset, the output signal So11 turns to the low level. Therefore, by monitoring whether the output signal So11 is in an invariant state (i.e., the state by determining whether the output signal So11 is in either the high level or low level as above), it is possible to determine whether the cable is connected to the input buffer 50.

Figure 3:
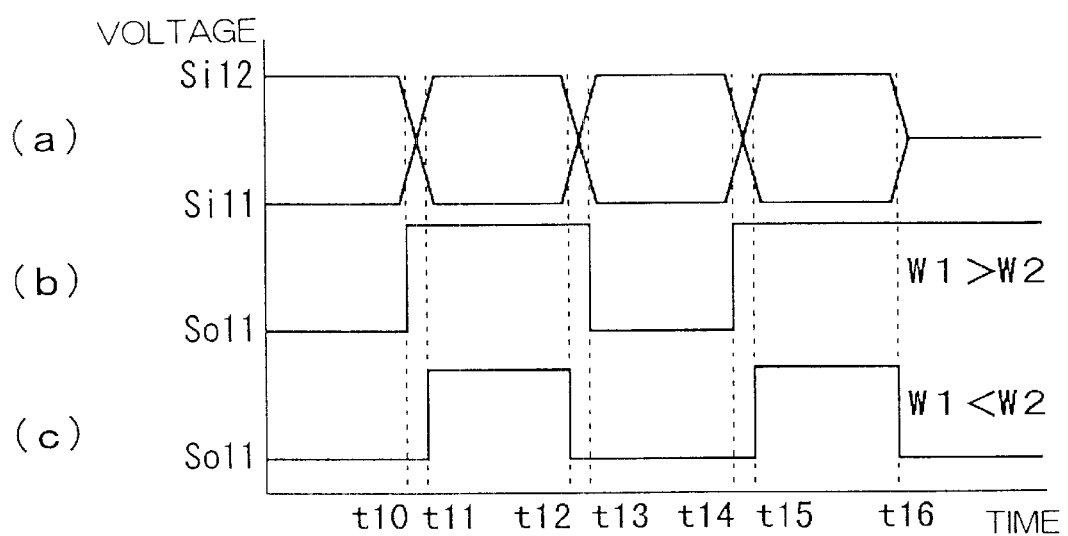
FIG. 3 is a diagram to show the operation of the input buffer circuit shown in FIG. 1.

FIG. 3 shows the operation of the input buffer 50 shown in FIG. 1. In this diagram, the horizontal axis represents time axis, and the vertical axis represents the voltage value axis. In FIG. 3, (a) shows the pattern of change in the first input signal Si11 and the second input signal Si12, (b) shows the output signal So11 when the minus offset is applied to the differential circuit, and (c) shows the output signal So11 when the plus offset is applied to the differential circuit.

When the minus offset is applied to the differential circuit (in the case of (b) in FIG. 3), the output signal So11 changes as follows. That is, at the points in time t10 and t14 when the magnitude of the first input signal Si11 is rising and the magnitude of the second input signal Si12 is falling, the level of the output signal So11 changes to the high level. Also, at the point in time t13 when the magnitude of the first input signal Si11 is falling and the magnitude of the second input signal Si12 is rising, the level of the output signal So11 changes to the low level.

In contrast, when the plus offset is applied to the differential circuit (in the case of (c) in FIG. 3), the output signal So11 changes as follows. That is, at the points in time t11 and t15 when the magnitude of the first input signal Si11 is rising and the magnitude of the second input signal Si12 is falling, the level of the output signal So11 changes to the high level. Also, at the points in time t12 and t16 when the magnitude of the first input signal Si11 is falling and the magnitude of the second input signal Si12 is rising, the level of the output signal So11 changes to the low level.

As explained above, in the input buffer 50, the output signal So11 changes when the magnitudes of the first and second input signals Si11, Si12 are either falling or rising, but the output signal So11 does not change when the magnitudes of the first and second input signals Si11, Si12 are equal. Therefore, even when the cable is removed from the input buffer 50, it is able to provide a concrete (determinate) signal level for the output signal So11. Accordingly, it is possible to avoid activating some erroneous operations of the circuit that receives the output signal So11, for example.

Embodiment 2

Figure 4:
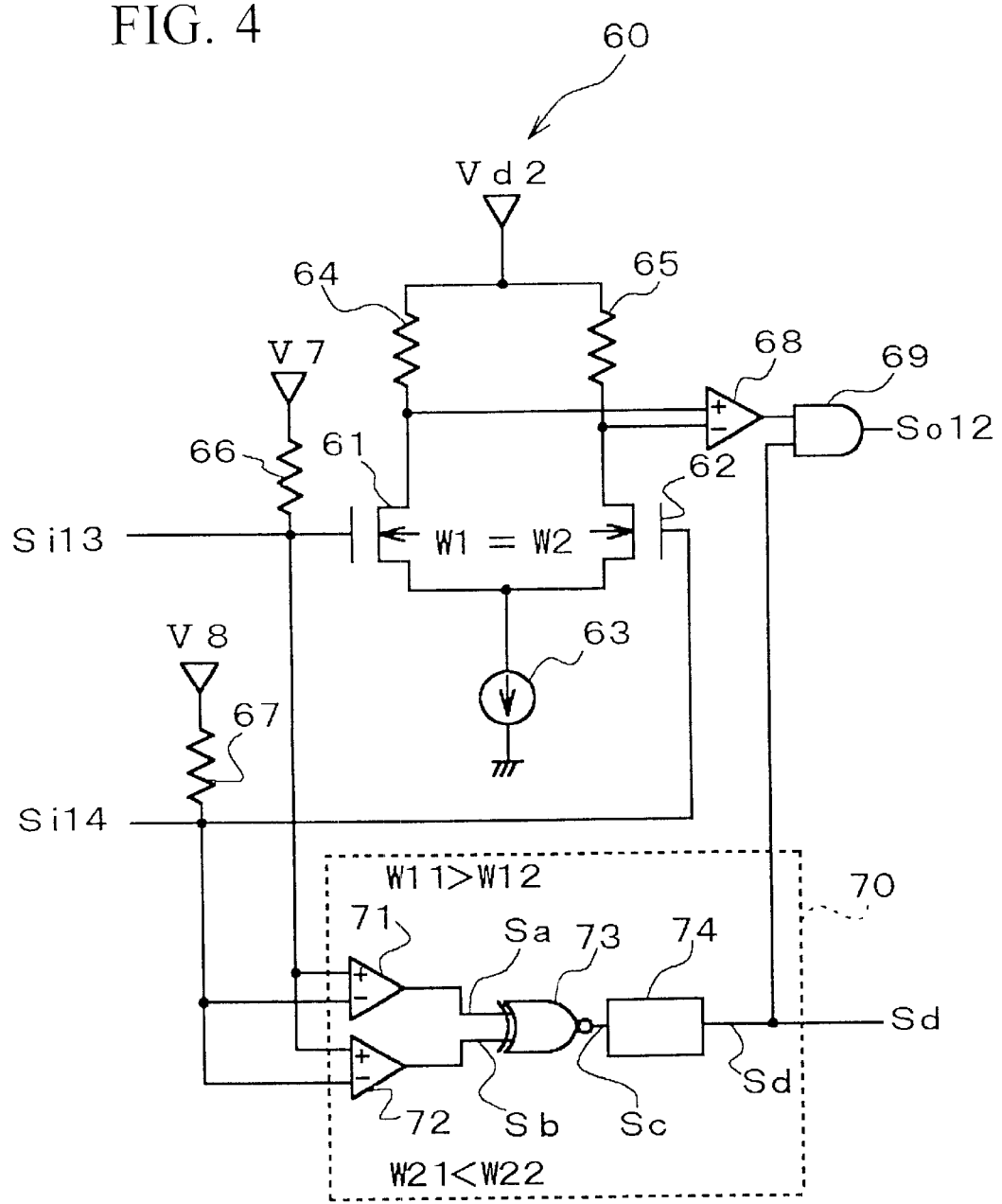
FIG. 4 is a schematic drawing of a second embodiment of the input buffer circuit with a function for detecting the cable connection, according to the present invention.

FIG. 4 shows a schematic diagram of the input buffer (circuit) 60 having a function for detecting the cable connection, according to the second embodiment of the present invention. The input buffer 60 includes a first transistor 61, a second transistor 62, a constant current source 63, and resistors 64, 65. Also, the input buffer 60 is provided with terminating resistors 66, 67, and is further provided with an output conversion circuit 68 and an AND circuit 69 as well as an output control circuit 70. The output control circuit 70 is provided with a first differential circuit 71, a second differential circuit 72 and an exclusive OR circuit 73, and is further provided with a filter circuit 74.

The drain (electrode) of the first transistor 61 is connected to the first resistor 64. The gate (electrode) of the first transistor 61 is connected to the first terminating resistor 66. The source (electrode) of the first transistor 61 is connected to the constant current source 63. The drain (electrode) of the second transistor 62 is connected to the second resistor 65. The gate (electrode) of the second transistor 62 is connected to the second terminating resistor 67. The source (electrode) of the second transistor 62 is connected to the constant current source 63. Further, the drain of the first transistor 61 is connected to the non-inverting input terminal of the output conversion circuit 68. The drain of the second transistor 62 is connected to the inverting input terminal of the output conversion circuit 68. The output terminal of the output conversion circuit 68 is connected to one input terminal of the AND circuit 69.

Non-inverting input of the first differential circuit 71 of the output control circuit 70 is connected to the gate of the first transistor 61. Inverting input of the first differential circuit 71 is connected to the gate of the second transistor 62. Non-inverting input of the second differential circuit 72 is connected to the gate of the first transistor 61. Inverting input of the second differential circuit 72 is connected to the gate of the second transistor 62. The output of the first differential circuit 71 is connected to the one input terminal of the exclusive OR circuit 73. The output of the second differential circuit 72 is connected to the other input terminal of the exclusive OR circuit 73. The output of the exclusive OR circuit 73 is connected to the input of the filter 74. The output of the filter 74 is connected to the other input terminal of the AND circuit 69.

The output side of the constant current source 63 is grounded. A drain voltage Vd2 is impressed on the first resistor 64 and the second resistor 65. A first terminating voltage V7 is impressed on the first terminating resistor 66. A second terminal voltage V8 is impressed on the second terminating resistor 67.

The differential circuit (differential amplifier circuit) in the input buffer 60 is comprised by the first transistor 61, the second transistor 62, the constant current source 63, the first resistor 64 and the second resistor 65. The first and second transistors 61, 62 are n-channel FETs in the CMOS circuit, and form a part of the CMOS circuit that includes the differential circuit. The constant current source 63 is a control circuit for regulating the source current of the first and second transistors 61, 62.

The output conversion circuit 68 is a comparator to compare the input voltages. The output conversion circuit 68 converts the output signal level of the differential circuit to the band level of the CMOS circuit, and output the converted signal. The width of the band level is 0 to 5 V. The AND circuit 69 executes the logical product of the output from the output conversion circuit 68 and the output from the filter 74. The AND circuit 69 fulfills a role such as a comparator to compare the output of the output conversion circuit 68 and the output of the filter 74, and generates an output signal So12 representing the logical product of those output values.

The first terminating resistor 66 has a resistance value that is equal to the characteristic impedance of the cable (omitted in the diagram) for transmitting the input signal Si13. The second resistor 67 has a resistance value that is equal to the characteristic impedance of the cable (omitted in the diagram) for transmitting the input signal Si14. These cables are attached to the input buffer 60, and one cable is connected to the gate electrode of the first transistor 61, and the other cable is connected to the gate electrode of the second transistor 62.

The gate length W1 of the first transistor 61 is made to equal the gate length W2 of the second transistor 62 (i.e., W1=W2). Therefore, when the magnitude of the input signal Si13 and the magnitude of the input signal Si14 are equal, the level of the output signal So12 alternates if the signal to the AND circuit 69 from the output control circuit 70 is at the high level.

The first differential circuit 71 has the same constituting elements as the above differential circuit comprised by the first transistor 61, the second transistor 62, the constant current source 63, the first resistor 64 and the second resistor 65. In the first differential circuit 71 having such a structure, the gate length W11 of the first transistor (omitted from the diagram) corresponding to the first transistor 61 is made longer than the gate length W12 of the second transistor (omitted from the diagram) corresponding to the second transistor 62. Accordingly, the input buffer 60 is designed so that the level of the output signal Sa of the first differential circuit 71 changes when the magnitude of the input signal Si13 is smaller than the magnitude of the input signal Si14 and also the difference between the magnitude of the input signal Si13 and the magnitude of the input signal Si14 is at a predetermined value.

The second differential circuit 72 has the same constituting elements as the above differential circuit comprised by the first transistor 61, the second transistor 62, the constant current source 63, the first resistor 64 and the second resistor 65. In the second differential circuit 72 having such a structure, the gate length W21 of the first transistor (omitted from the diagram) corresponding to the first transistor 61 is made shorter than the gate length W22 of the second transistor (omitted from the diagram) corresponding to the second transistor 62. Accordingly, the input buffer 60 is designed so that the level of the output signal Sb of the second differential circuit 72 changes when the magnitude of the input signal Si13 is larger than the magnitude of the input signal Si14 and also the difference between the magnitude of the input signal Si13 and the magnitude of the input signal Si14 is at a predetermined value.

The exclusive OR circuit 73 executes a non-equivalence operation. That is, the exclusive OR circuit 73 receives the output signal Sa from the first differential circuit 71 and the output signal Sb from the second differential circuit 72, and performs a non-equivalence operation of the output signals Sa, Sb, and outputs the operation result as the output signal Sc. The filter 74 is a low-pass filter. This filter 74 receives the output signal Sc, and removes high frequency components from the output signal Sc, and outputs the signal from which high frequency components have been removed as its output signal Sd.

Figure 5:
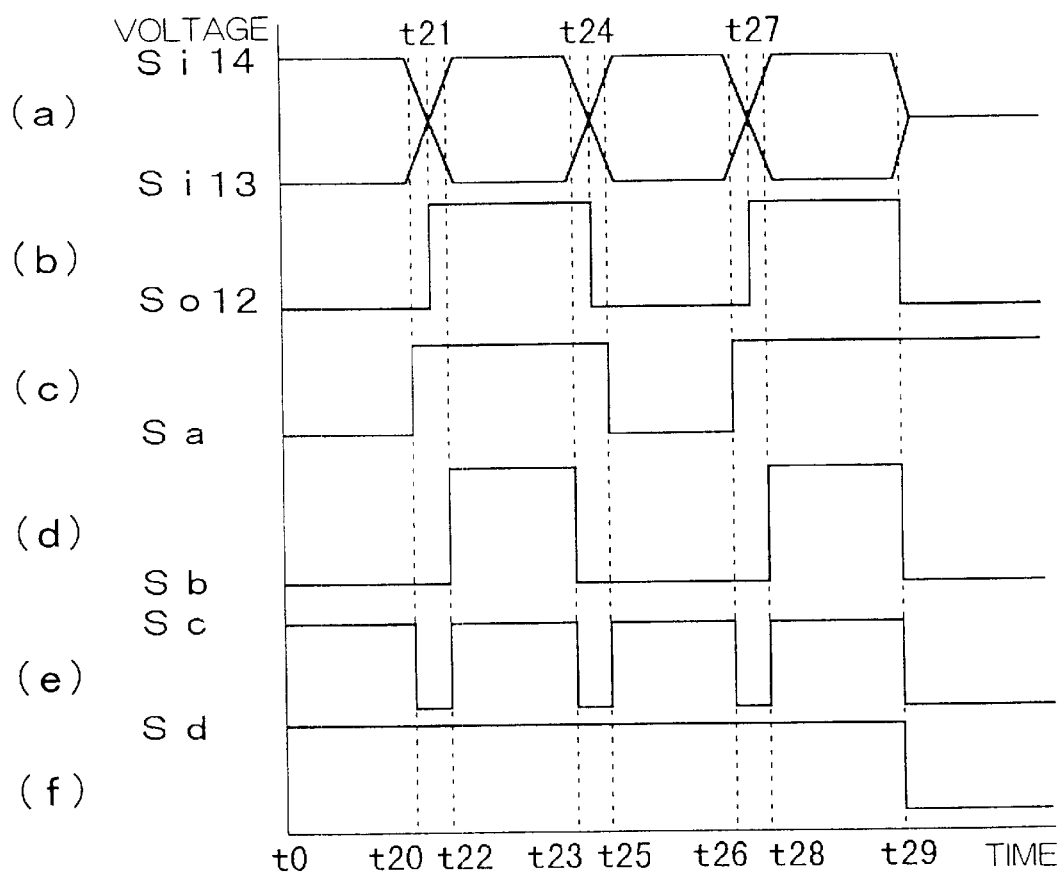
FIG. 5 is a diagram to show the operation of the input buffer circuit shown in FIG. 4.

FIG. 5 shows the operation of the input buffer 60 shown in FIG. 4. In FIG. 5, the horizontal axis represents time axis, and the vertical axis represents the voltage value axis. In this Figure, (a) shows the pattern of voltage changes in the first input signal Si13 and the second input signal Si14, (b) shows the output signal So12 from the AND circuit 69, (c) shows the output signal Sa from the first differential circuit 71, (d) shows the output signal Sb from the second differential circuit 72, (e) shows the output signal Sc from the exclusive OR circuit 73, (f) shows the output signal Sd from the filter 74.

As shown in these diagrams, at time t0, it is assumed that the magnitude of the first input signal Si13 is at the low level and the magnitude of the second input signal Si14 is at the high level. In this case, at time t0, the output signals So12, Sa and Sb all exhibit the low levels, and output signals Sc and Sd exhibit the high levels.

Then, if the magnitude of the first input signal Si13 rises and the magnitude of the second input signal Si14 falls, and time reaches time t20 (so that Si13<Si14 and the difference between the input signals Si13, Si14 reaches the predetermined value), the level of the output signal Sa changes to the high level, and simultaneously, the level of the output signal Sc changes to the low level. Here, at this point in time t20, the output signal So12 is still at the low level.

At time t21 when the magnitudes of the first and second input signals Si13, Si14 become equal, the signal level of the signal output from the differential circuit through the output conversion circuit 68 changes, thereby changing the level of the output signal So12 to the high level. At this time, the output signal Sd is still at the high level because of the effect of the filter 74 which removes high frequency components.

Then, if the magnitude of the first input signal Si13 continues to rise and the magnitude of the second input signal Si14 continues to fall, and time reaches time t22 (so that Si13>Si14 and the difference between the input signals Si13, Si14 reaches the above predetermined value), the level of the output signal Sb changes to the high level, and simultaneously, the level of the output signal Sc returns to the high level. Here, the output signal Sd maintains the high level by the effect of the filter 74. The output signal So12 maintains the high level after changing to the high level at the above-mentioned time t21.

Subsequently, if the magnitude of the first input signal Si13 decreases and the magnitude of the second input signal Si14 increases, and time reaches time t23 (so that Si13>Si14 and the difference between the input signals Si13, Si14 reaches the predetermined value), the level of the output signal Sb changes to the low level, and simultaneously, the level of the output signal Sc changes to the low level. Here, at this point in time t23, the output signal Sd is still at the high level, and therefore, the output signal So12 remains at the high level.

At time t24 when the magnitude of the first input signal Si13 and the magnitude of the second input signal Si14 become equal, the level of the signal output from the differential circuit through the output conversion circuit 68 changes, thereby changing the level of the output signal So12 to the low level. At this time, the output signal Sd is still at the high level because of the effect of the filter 74.

Then, the magnitude of the first input signal Si13 continues to decrease and the magnitude of the second input signal Si14 continues to increase, and time reaches time t25 (so that Si13<Si14 and the difference between the input signals Si13, Si14 reaches the above predetermined value), then the level of the output signal Sa changes to the low level, and simultaneously, the level of the output signal Sc returns to the high level. Here, as before, the output signal Sd maintains the high level. After changing to the low level at the above-mentioned time t24, the output signal So12 maintains the low level at this time t25.

Between the two points at times t26 to t28, the first input signal Si13 and the second input signal Si14 change in a manner similar to that exhibited between time t20 to t22. Therefore, the waveforms of the signals at times t26, t27 and t28 are the same as those at times t20, t21 and t22.

Subsequently, at time t29, it is assumed that the cables are detached from the input buffer 60. Accordingly, the two input points into the differential circuit are open state, and the level of the output signal of the differential circuit becomes indeterminate.

At this time, the magnitude of the first input signal Si13 and the magnitude of the second input signal Si14 are equal, so that the output signal Sa of the first differential circuit 71 is at the high level and the output signal Sb of the second differential circuit 72 turns to the low level. It follows that the output signal Sc of the exclusive OR circuit 73 turns to the low level, and as long as the cables are detached, this condition is maintained. Therefore, the output signal Sd of the filter 74 becomes the low level from the point in time t29. This low level output signal Sd is input into the AND circuit 69, so that the output signal So12 of the AND circuit 69 is fixed at the low level. By so doing, output signal, which is in the indeterminate state, of the output conversion circuit 68 is masked, and subsequent to time t29, the level of the output signal So12 of the AND circuit 69 becomes the low level.

Also, by monitoring the output signal Sd that became the low level, or output signals Sd or So12 that continue to maintain the low level, it is possible to determine whether the cables are attached to the input buffer 60.

Embodiment 3

Figure 6:
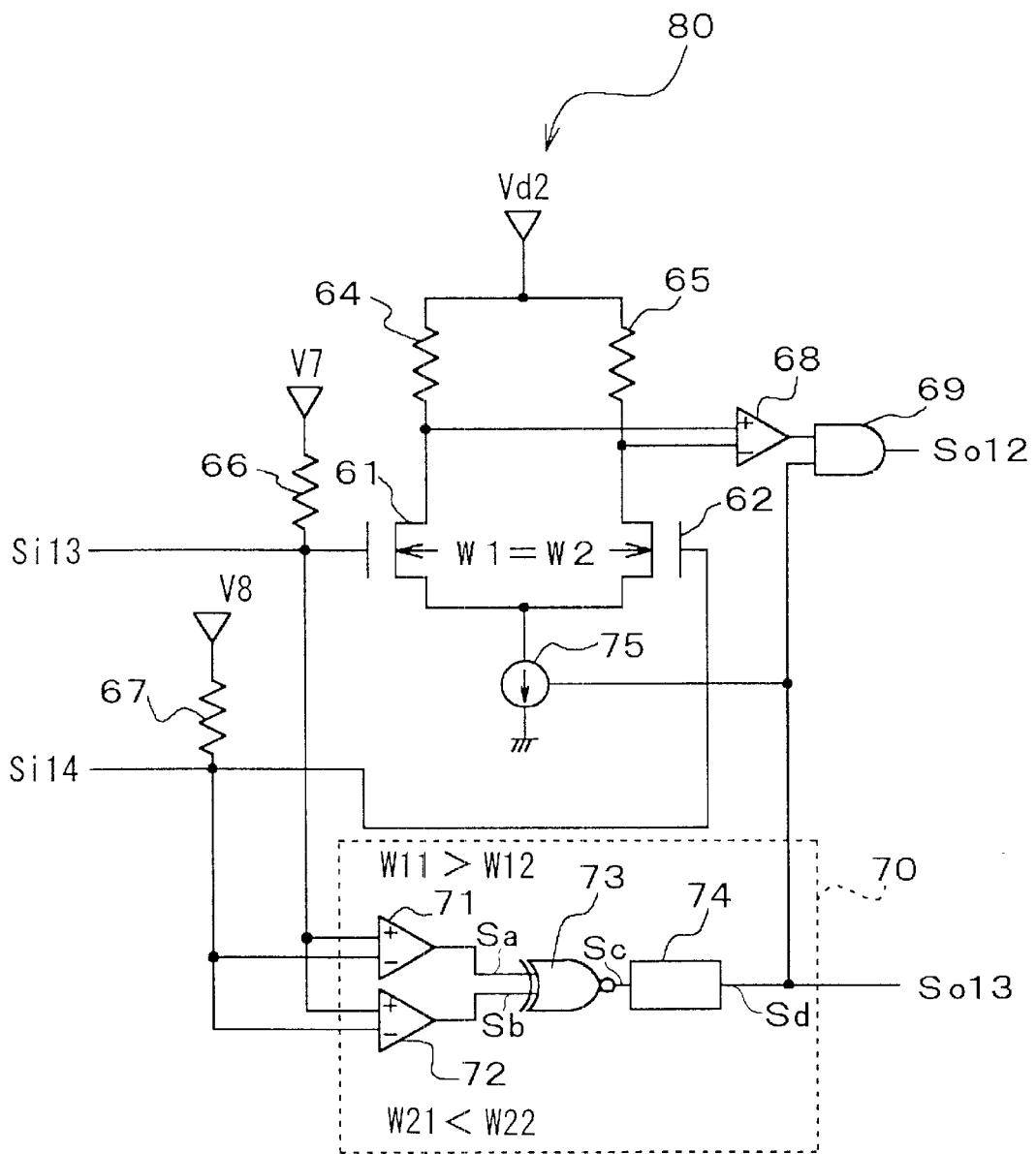
FIG. 6 is a schematic drawing of a third embodiment of the input buffer circuit with a function for detecting the cable connection, according to the present invention.
Figure 7:
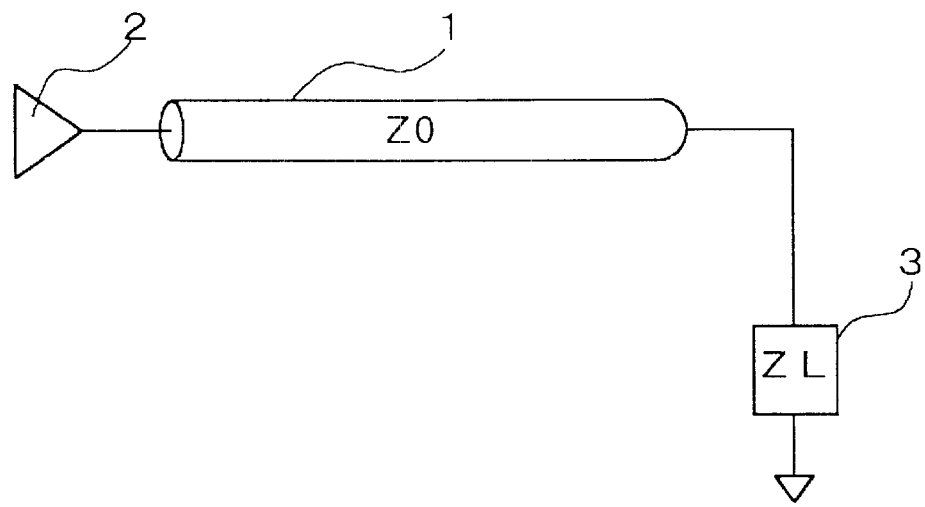
FIG. 7 is an illustration to show the connection relationship between the characteristic impedance and the load impedance.
Figure 8:
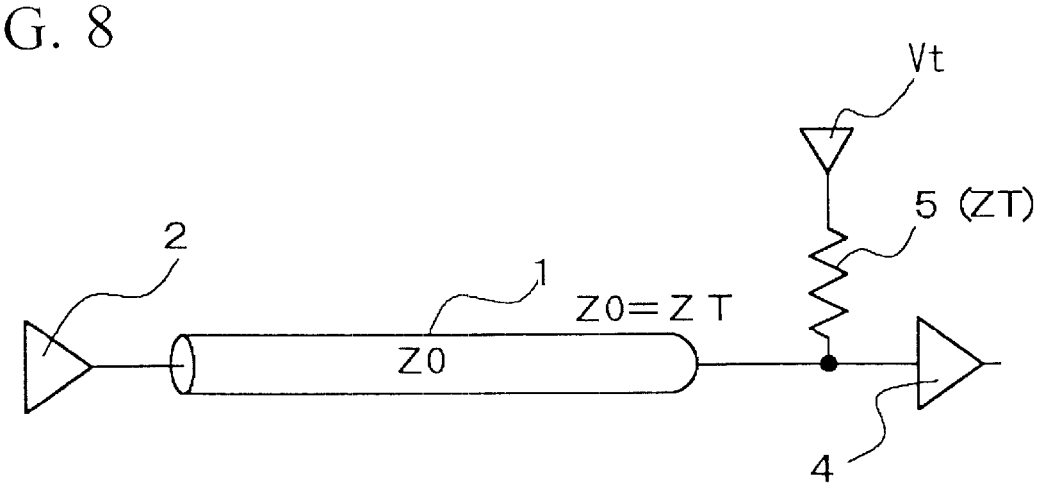
FIG. 8 is an illustration to show the connection relationship between the characteristic impedance and the terminating resistor.
Figure 9:
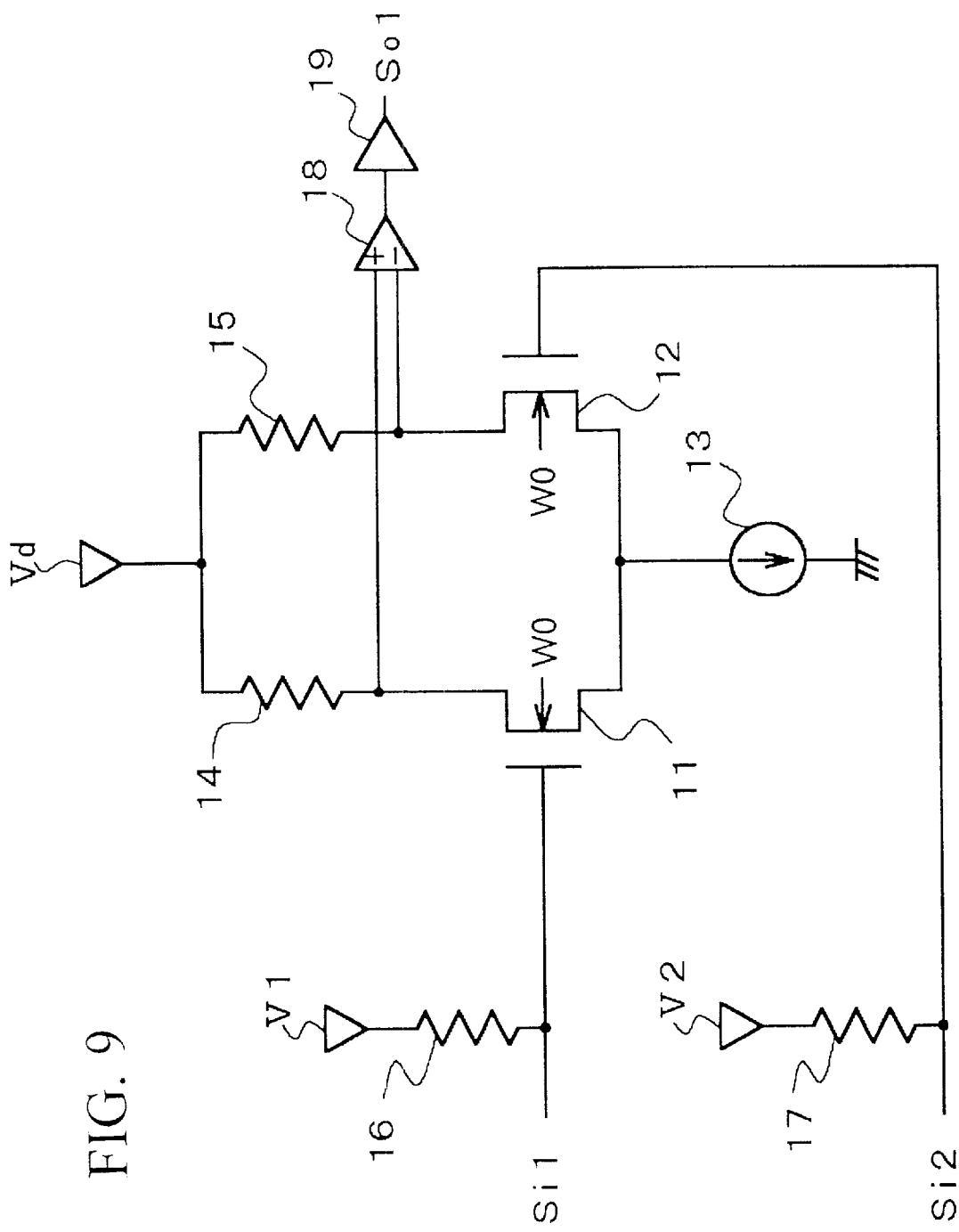
FIG. 9 is a schematic circuit diagram of an example of an input buffer receiving signals through a cable.
Figure 10:
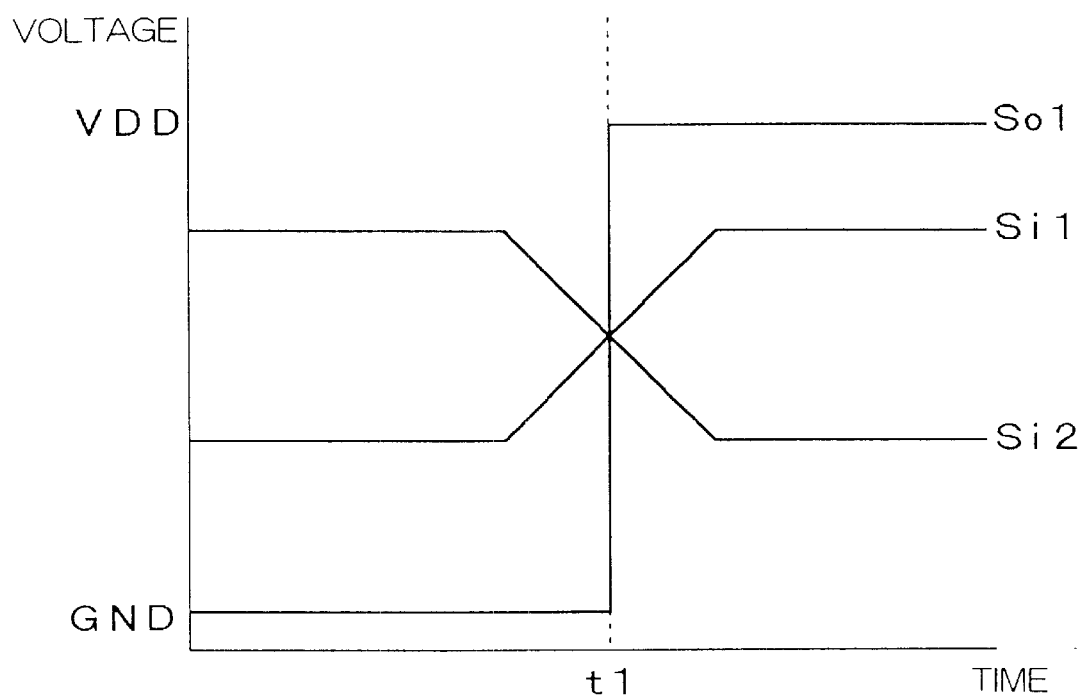
FIG. 10 is a graph to show the operating characteristics of the input buffer shown in FIG. 9.
Figure 11:
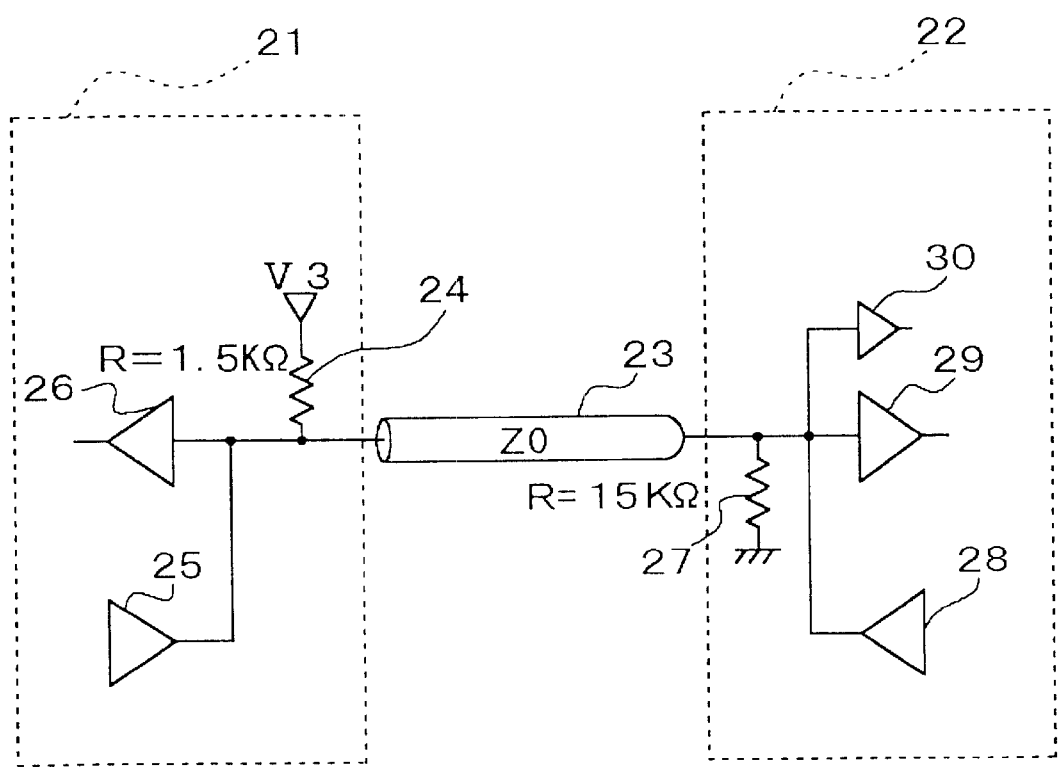
FIG. 11 is a schematic circuit diagram of an example of the USB system.
Figure 12:
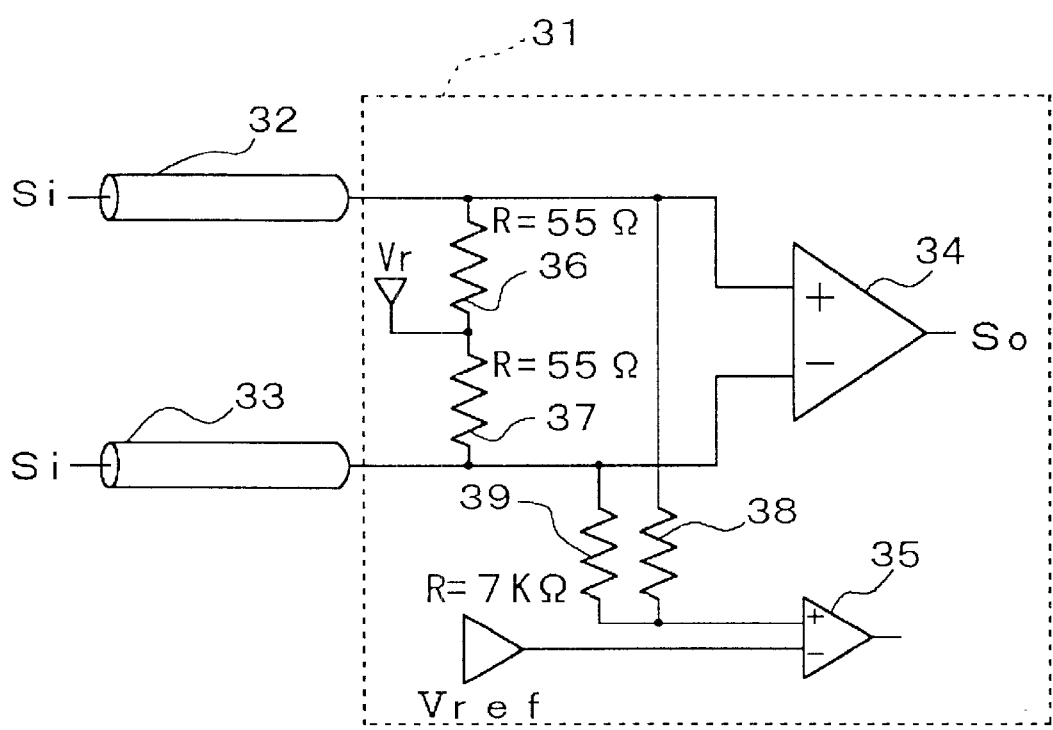
FIG. 12 is a schematic circuit diagram of an example of the IEEE 1394 system.

FIG. 6 shows the input buffer (circuit) 80 having a function for detecting the cable connection, according to the third embodiment of the present invention. The input buffer 80 shown in this diagram is similar to the input buffer 60 shown in FIG. 4, except for the current source 75, and therefore, the same constituting elements are shown by the same reference symbols and their explanations are omitted. Also, the overall operation is similar to the operation of the input buffer 60 explained with reference to FIG. 5, except for the operation associated with the current source 70 which will be explained later.

The current source 75 for the input buffer 80 is different from the constant current source 63 of the input buffer 60 described above. This current source 75 is connected with the output side of the filter 74, and changes the supply current depending on the content of the output signal Sd from the filter 74.

When the output signal Sd is at the high level (during the interval between time t0 to t29 in FIG. 5), the current source 75 supplies a predetermined amount of current. While the current source 75 is supplying this current, the input buffer 80 is activated, and functions in the same manner as the input buffer 60 described above.

In contrast, when the output signal Sd is at the low level (after time t29 in FIG. 5), the current source 75 operates in the standby mode by either stopping or decreasing the supply of current. While the current source 75 is operating in such a standby mode, the power consumption in the input buffer 80 is reduced. Therefore, it is possible to avoid wasting power while the cables are detached, for example.

As explained above, according to the present input buffer circuit having a cable connection detection function, it is possible to detect a condition in which the cable is detached from the buffer. Also, according to the present input buffer circuit having a cable connection detection function, it is possible to avoid the condition which causes the generation of indeterminate signal levels. Further, according to the present input buffer circuit having a cable connection detection function, it is possible to reduce power consumption while the cable is detached from the input buffer.

The present invention has been explained with reference to drawings of examples, but the structure of the input buffer circuit is not limited to those shown in the specific examples, and design modifications of the basic design concept are intended to be embraced therein.

What is claimed is:

1. An input buffer circuit having a function for detecting the cable connection, comprising:
   a differential circuit for receiving differential data having first data and second data, and changing a signal level of an output signal when a difference between a signal level of the first data and a signal level of the second data exhibits a predetermined value; and
   a conversion circuit for matching the signal level of the output signal to a specific band level,
   wherein said differential circuit is provided with a pair of field-effect transistors, each transistor having a different gate length, and
   wherein when the two differential input signals have the same level, the differential circuit offsets one out of the two amplified differential output signals; and a comparator corresponding to the conversion circuit extends high or low level bandwidths of the buffer output signal.

2. An input buffer circuit according to claim 1, further comprising a constant current source for supplying a constant amount of current to said differential circuit.

3. An input buffer circuit having a function for detecting the cable connection, comprising:
   a differential circuit for receiving differential data having first data and second data, and changing a signal level of an output signal when a signal level of the first data and a signal level of the second data are equal;
   a conversion circuit for matching the signal level of the output signal to a specific band level; and
   an output control circuit for setting the signal level of the output signal at a specific value according to the signal level of the first data and the signal level of the second data, said output control circuit, including the two differential circuits each including a pair of field-effect transistors having different gate lengths,
   wherein when signal levels of two differential input signals are the same, the differential circuit amplifies both signals, the output control circuit outputs a high level signal when two differential output signals are input, and the output control circuit outputs a low level signal when two differential output signals are not input, and a logic circuit outputs the differential output signal of said differential circuit as an output of the buffer circuit in synchronism with the output of the output control circuit.

4. An input buffer circuit according to claim 3, wherein said output control circuit limits electrical power supplied to said differential circuit according to the signal level of the first data and the signal level of the second data.

5. An input buffer circuit according to claim 3, wherein said output control circuit is provided with a comparator.

6. An input buffer circuit according to claim 3, further comprising a constant current source for supplying a constant amount of current to said differential circuit.

7. An input buffer circuit according to claim 4, further comprising a current source for supplying current to said differential circuit, wherein,
   said output control circuit changes the amount of the current supplied by said current source according to the signal level of the first data and the signal level of the second data so as to limit the power supplied to said differential circuit.

8. An input buffer circuit according to claim 3, wherein said output control circuit fixes the signal level of the output signal to a specific value when the signal level of the first data and the signal level of the second data are equal.

9. An input buffer circuit, for receiving a first signal and a second signal through a cable and generating an output signal having a signal level determined by the magnitudes of those received signals, including a differential circuit for changing the signal level of the output signal when the magnitude of the first signal and the magnitude of the second signal are not equal,
   wherein said differential circuit is provided with a pair of field-effect transistors having respective gates that are connected to the cable, and respective gate lengths are different from each other.

10. An input buffer circuit according to claim 9, having a function for detecting the cable connection, in which when the magnitude of the first signal and the magnitude of the second signal are equal, said differential circuit sets the signal level of the output signal to a constant level.

11. An input buffer circuit, for receiving a first signal and a second signal through a cable and generating an output signal having a signal level determined by the magnitudes of those received signals, comprising:

a differential circuit for determining the signal level of said output signal by its signal output, wherein said differential circuit outputs a signal to change the signal level of said output signal when the magnitude of the first signal and the magnitude of the second signal are equal; and an output control circuit for outputting a signal of a constant level when the magnitude of the first signal and the magnitude of the second signal are equal; wherein, the signal output of said differential circuit is masked by using the signal of the constant level output from said output control circuit, so that the signal level of said output signal when the magnitude of the first signal and the magnitude of the second signal are equal is set to a predetermined level.

12. An input buffer circuit according to claim 11, including a logical product circuit for receiving the signals output from said differential circuit and said output control circuit, and outputting the logical product of said signals.

13. An input buffer circuit according to claim 11, further comprising a current source for supplying an operating current to said differential circuit, wherein, said output control circuit changes the amount of the current supplied by said current source when the magnitude of the first signal and the magnitude of the second signal are equal so as to limit the power supplied to said differential circuit.

* * * * *